(12) United States Patent
Wang et al.

(10) Patent No.: US 12,385,982 B2
(45) Date of Patent: Aug. 12, 2025

(54) DIAGNOSTICS AND MITIGATION OF BATTERY CELL FAILURE WITH PASSIVE DISCONNECT

(71) Applicant: GM Global Technology Operations LLC, Detroit, MI (US)

(72) Inventors: Yue-Yun Wang, Troy, MI (US); Shifang Li, Shelby Township, MI (US); Chaitanya Sankavaram, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 377 days.

(21) Appl. No.: 17/946,594

(22) Filed: Sep. 16, 2022

(65) Prior Publication Data

US 2024/0110993 A1   Apr. 4, 2024

(51) Int. Cl.
| | |
|---|---|
| *G06F 11/30* | (2006.01) |
| *G01R 31/36* | (2020.01) |
| *G01R 31/3828* | (2019.01) |
| *G01R 31/3835* | (2019.01) |
| *G01R 31/389* | (2019.01) |
| *G01R 31/392* | (2019.01) |
| *H01M 50/204* | (2021.01) |

(52) U.S. Cl.
CPC ....... *G01R 31/392* (2019.01); *G01R 31/3648* (2013.01); *G01R 31/3828* (2019.01); *G01R 31/3835* (2019.01); *G01R 31/389* (2019.01); *H01M 50/204* (2021.01); *H01M 2200/103* (2013.01); *H01M 2220/20* (2013.01)

(58) Field of Classification Search
CPC ....................................... G01R 31/392
See application file for complete search history.

(56) References Cited

FOREIGN PATENT DOCUMENTS

| | | | |
|---|---|---|---|
| AU | 2005246945 | * | 12/2005 |
| CN | 106882051 | * | 6/2019 |
| CN | 110979097 | * | 4/2020 |
| EP | 2786891 | * | 10/2014 |
| KR | 20090015245 | * | 2/2009 |

\* cited by examiner

*Primary Examiner* — Phuong Huynh
(74) *Attorney, Agent, or Firm* — CANTOR COLBURN LLP

(57) ABSTRACT

A vehicle includes a system that performs method operating a battery pack of the vehicle. The system includes one or more sensors and a processor. The one or more sensors obtain a measured value of a battery parameter of the battery pack. The processor is configured to calculate an expected value of the battery parameter from a model of the battery pack, compare the measured value to the expected value to determine a blown fuse condition of the battery pack, determine an available current from the battery pack based on the blown fuse condition, and control an operational state of the vehicle based on the available current.

20 Claims, 8 Drawing Sheets

DIAGNOSTICS AND MITIGATION OF BATTERY CELL FAILURE WITH PASSIVE DISCONNECT

INTRODUCTION

The subject disclosure relates to battery packs used in vehicles and, in particular, to a system and method for determining a number of healthy battery cells available in the battery pack.

A battery pack is used in a vehicle to provide power for various electrical loads of the vehicle. The battery pack includes a plurality of cell groups, each cell group having a plurality of battery cells. Each battery cell has an associated fuse for protecting the battery cell in case of an over current event. When a fuse blows, the electrical load is shifted to the remaining functional cells of the battery pack. Without knowing how many fuses have blown, one is not able to adjust the electrical loads to accommodate new electrical power limits of the battery pack. Accordingly, it is desirable to provide a system and method for determining a number of healthy battery cells in a battery pack or, equivalently, determining a number of blown fuses in the battery pack.

SUMMARY

In one exemplary embodiment, a method operating a battery pack of a vehicle is disclosed. A measured value a battery parameter of the battery pack is obtained. An expected value of the battery parameter is calculated from a model of the battery pack. The measured value is compared to the expected value to determine a blown fuse condition of the battery pack. An available current from the battery pack is determined based on the blown fuse condition. An operational state of the vehicle is controller based on the available current.

In addition to one or more of the features described herein, the expected value is indicative of a number of blown fuses in a cell group of the battery pack. Comparing the measured value to the expected value further includes at least one of comparing a first ratio including the measured value to a second ratio including the expected value and calculating a difference between the measured value and the expected value. The ratio is at least one of a capacity ratio and a resistance ratio. The method further includes calculating the capacity ratio using a first set of voltage measurements obtained from cell groups of the battery pack at a first time and a second set of voltage measurements obtained from the cell groups at a second time. The method further includes calculating the resistance ratio based on a first drop voltage for a first cell group obtained during a rest period and a second drop voltage for a second cell group obtained during the rest period. The battery parameter is at least one of a resistance, a capacity, a voltage, and a temperature.

In another exemplary embodiment, a system for operating a battery pack of a vehicle is disclosed. The system includes one or more sensors and a processor. The one or more sensors obtain a measured value of a battery parameter of the battery pack. The processor is configured to calculate an expected value of the battery parameter from a model of the battery pack, compare the measured value to the expected value to determine a blown fuse condition of the battery pack, determine an available current from the battery pack based on the blown fuse condition, and control an operational state of the vehicle based on the available current.

In addition to one or more of the features described herein, the expected value is indicative of a number of blown fuses in a cell group of the battery pack. The processor is further configured to compare the measured value to the expected value by performing at least one of comparing a first ratio including the measured value to a second ratio including the expected value and calculating a difference between the measured value and the expected value. The ratio is at least one of a capacity ratio and a resistance ratio. The processor is further configured to calculate the capacity ratio using a first set of voltage measurements obtained from cell groups of the battery pack at a first time and a second set of voltage measurements obtained from the cell groups at a second time. The processor is further configured to calculate the resistance ratio based on a first drop voltage for a first cell group obtained during a rest period and a second drop voltage for a second cell group obtained during the rest period wherein the ratio is a resistance ratio based on a first drop voltage for a first cell group. The battery parameter is at least one of a resistance, a capacity, a voltage, and a temperature.

In yet another exemplary embodiment, a vehicle is disclosed. The vehicle includes a battery pack, one or more sensors and a processor. The one or more sensors obtain a measured value of a battery parameter of the battery pack. The processor is configured to calculate an expected value of the battery parameter from a model of the battery pack, compare the measured value to the expected value to determine a blown fuse condition of the battery pack, determine an available current from the battery pack based on the blown fuse condition, and control an operational state of the vehicle based on the available current.

In addition to one or more of the features described herein, the expected value is indicative of a number of blown fuses in a cell group of the battery pack. The processor is further configured to compare the measured value to the expected value by performing at least one of comparing a first ratio including the measured value to a second ratio including the expected value and calculating a difference between the measured value and the expected value. The ratio is at least one of a capacity ratio and a resistance ratio. The processor is further configured to calculate the capacity ratio using a first set of voltage measurements obtained from cell groups of the battery pack at a first time and a second set of voltage measurements obtained from the cell groups at a second time. The processor is further configured to calculate the resistance ratio based on a first drop voltage for a first cell group obtained during a rest period and a second drop voltage for a second cell group obtained during the rest period wherein the ratio is a resistance ratio based on a first drop voltage for a first cell group.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
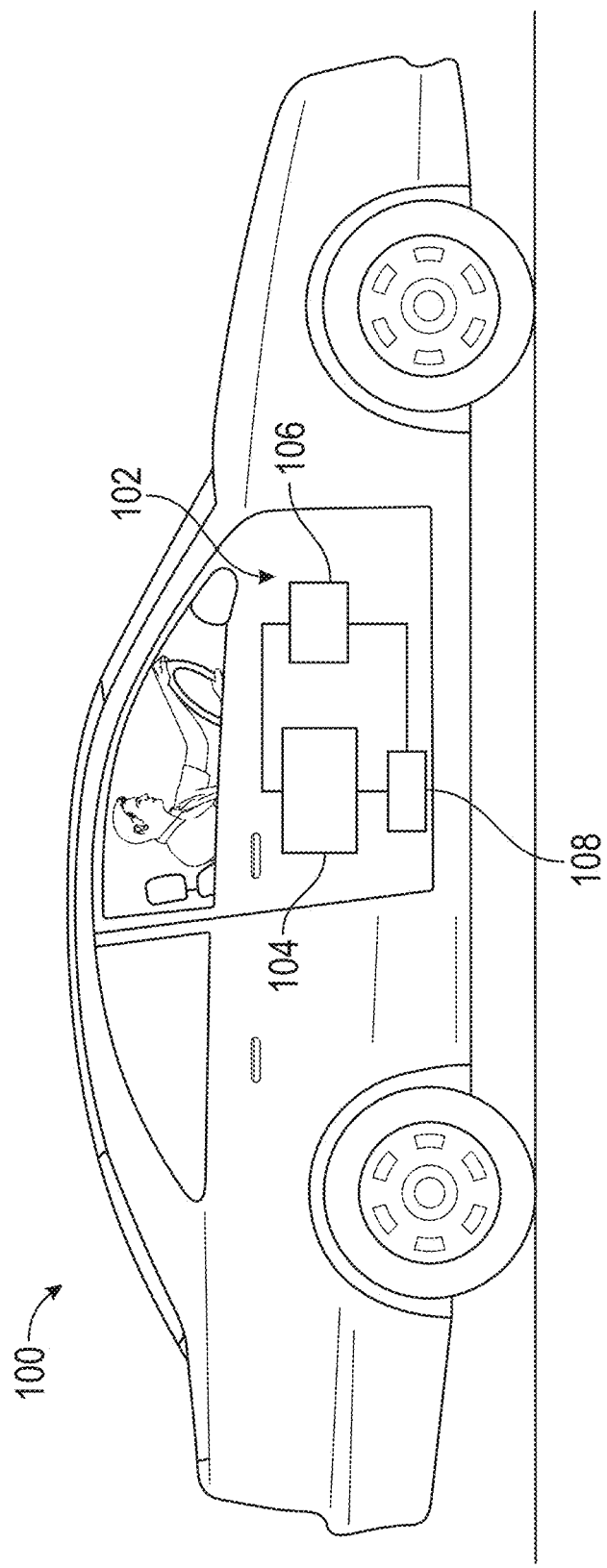
FIG. 1 shows a vehicle in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with an exemplary embodiment, FIG. 1 shows a vehicle 100. The vehicle 100 can be a conventional gasoline-powered vehicle, a diesel-powered vehicle, a hybrid vehicle, an electric vehicle, etc. The vehicle 100 includes an electrical system 102 including a battery pack 104 and a one or more electrical loads 106 which operate off power provided by the battery pack. The battery pack 104 can include one or more sensors that obtain measurements of battery parameters of the battery pack. The vehicle 100 further includes a controller 108. The controller 108 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. The controller 108 may include a non-transitory computer-readable medium that stores instructions which, when processed by one or more processors of the controller 108, implement a method of controlling an operation of the vehicle 100, the electrical system 102, battery pack 104 and/or electrical loads 106, according to one or more embodiments detailed herein.

Figure 2:
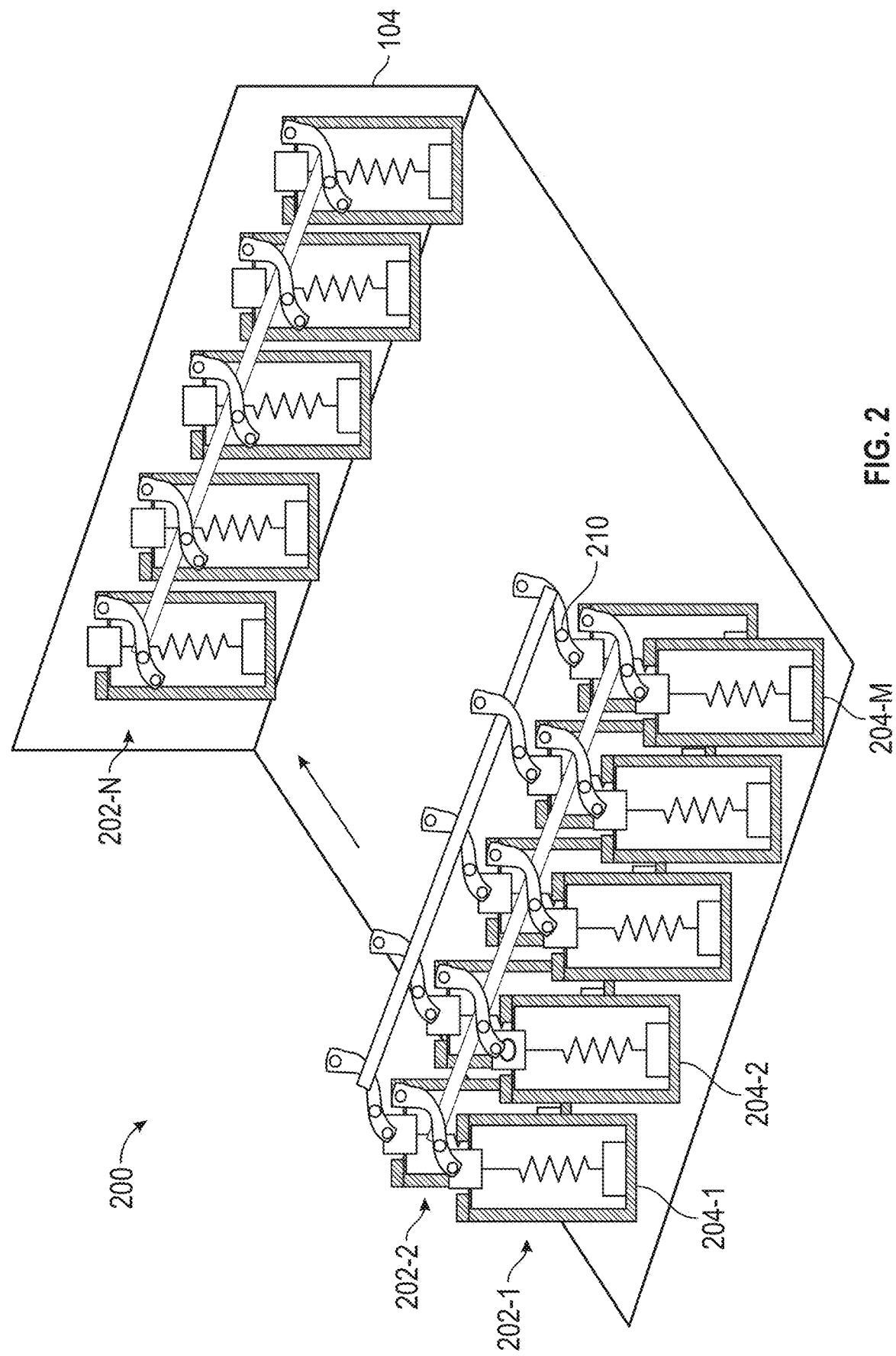
FIG. 2 is a diagram depicting the battery pack of the vehicle, in an illustrative embodiment.

FIG. 2 is a diagram 200 depicting the battery pack 104 of the vehicle 100, in an illustrative embodiment. The battery pack 104 includes a plurality of cell groups 202-1, . . . , 202-N that are coupled to each other in series. Each cell group includes a plurality of battery cells 204-1, . . . , 204-M that are connected to each other in parallel. For illustrative purposes, the battery pack 104 includes 208 cell groups (N=208), with each cell group including 5 battery cells (M=5). Each battery cell has a cell resistivity $R_c$. Thus, the resistivity of a cell group is $R_c/5$ and the resistivity of the battery is $208*(R_c/5)+R_{other}$, where $R_{other}$ includes any additional battery pack resistance unrelated to battery cell resistance.

Each battery cell has an associated fuse (such as fuse 210) that protects the battery cell in the case of an over current or high current. When a fuse blows on a battery cell, the battery cell becomes disconnected from the cell group. This affects the overall power that the cell group (and thus the battery pack) can provide as well as cell group resistance, thereby requiring adjustment of the power drawn by the electrical loads 106 so that additional battery cells do not exceed their current limits or safety limits.

Figure 3:
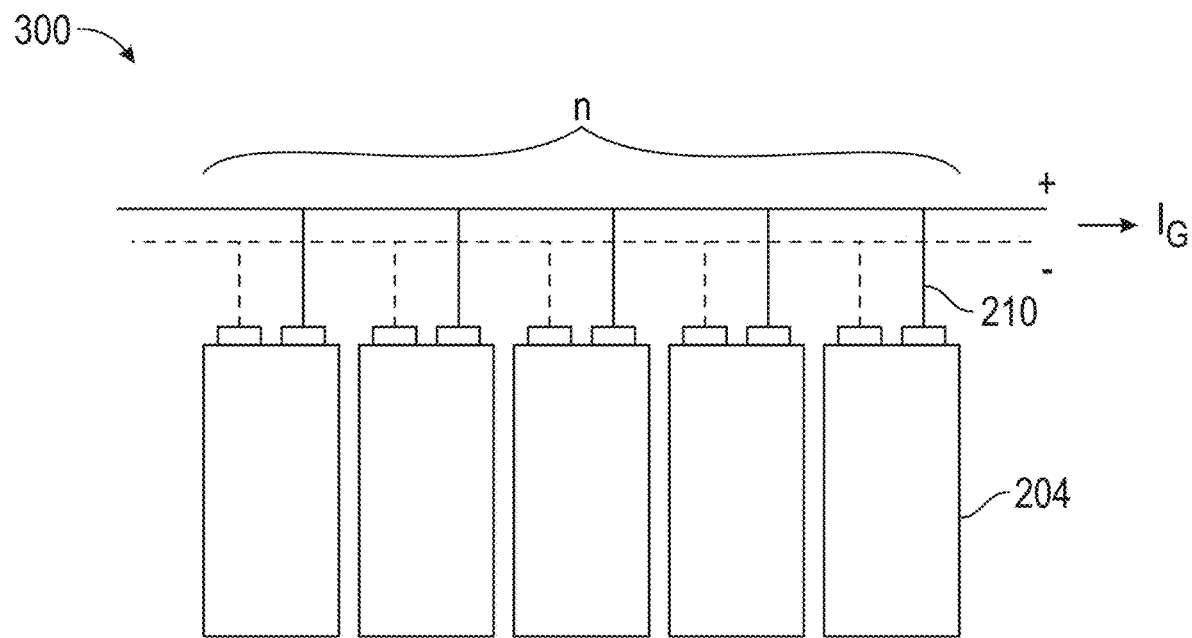
FIG. 3 shows a healthy cell group having a complete set of healthy battery cells.

FIG. 3 shows a healthy cell group 300 having a complete set of healthy battery cells. The group current $I_G$ for the healthy cell group 300 is equal to the current supplied by its battery cells, as shown in Eq. (1):

$$I_G = n \cdot I_c \qquad \text{Eq. (1)}$$

where n is the number of battery cells in the cell group and $I_c$ is the current of each battery cell.

Figure 4:
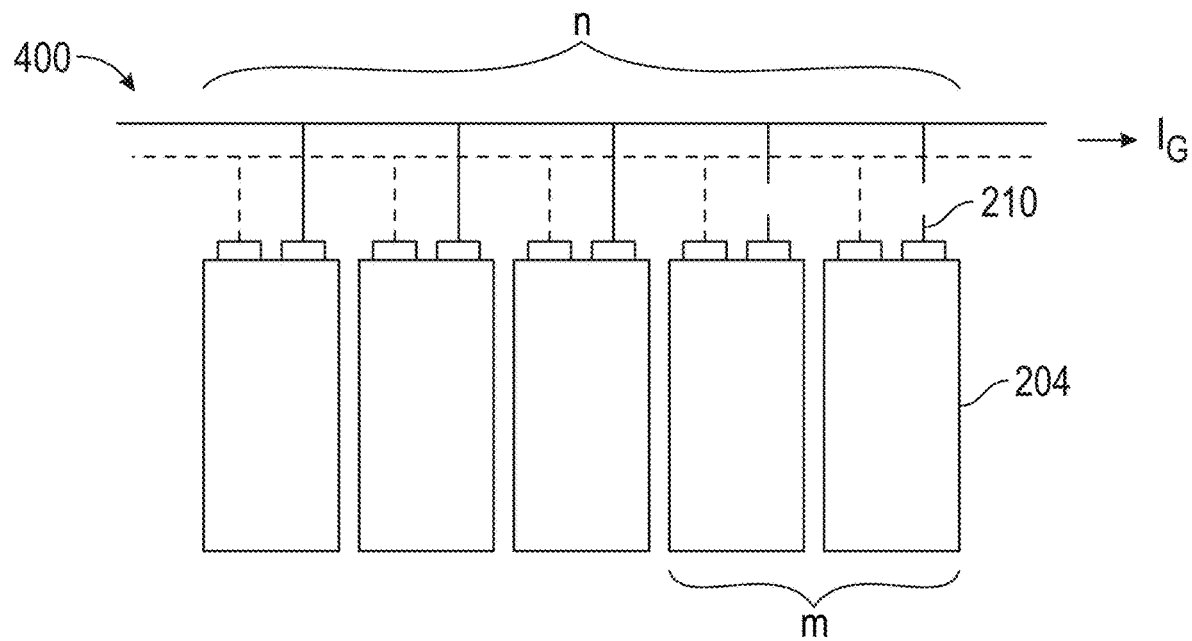
FIG. 4 shows an impaired cell group in an illustrative embodiment.

FIG. 4 shows an impaired cell group 400 in an illustrative embodiment. The impaired cell group 400 includes m battery cells for which their associated fuses have blown. Therefore, these m battery cells no longer contribute to the group current. The group current for the impaired cell group 400 is stated as:

$$I_G = (n-m) \cdot I_c \qquad \text{Eq. (2)}$$

Table 1 details the expected effects that a blown fuse condition (i.e., one or more blown fuses) has on various battery parameters of the cell group. A battery parameter can be an electrical parameter, such as current, voltage, resistance, capacitance, etc., and/or a thermal parameter, such as temperature. Values in Table 1 are calculated based on a model of the battery pack. The first column lists a number of fuses blown within a cell group. The second column shows the expected group resistance of the cell group resulting from the number of fuses blown. The third column shows the expected group capacitance of the cell group. The fourth column shows the expected group temperature. The fifth column shows the expected drop voltage for the cell group.

TABLE 1

| # Fuses Blown | Cell Group Resistance | Group Capacitance | Group Temperature | Group Drop Voltage |
|---|---|---|---|---|
| 0 | $R_0$ | $CAP_0$ | T | $\Delta V(\varepsilon) = I$ |
| 1 | $\frac{5}{4}R_0$ | $\frac{4}{5}CAP_0$ | $T > T_{adj\ cell\ group}$ | $\Delta V = \frac{1}{4}IR_0$ |
| 2 | $\frac{5}{3}R_0$ | $\frac{3}{5}CAP_0$ | $T > T_{adj\ cell\ group}$ | $\Delta V = \frac{2}{3}IR_0$ |
| m | $\frac{n}{n-m}R_0$ | $\frac{n-m}{n}CAP_0$ | $T > T_{adj\ cell\ group}$ | $\Delta V = \frac{m}{n-m}IR_0$ |

The first row of Table 1 shows the expected values of the battery parameters for when no fuses are blown. The battery parameters include a nominal cell group resistance $R_0$, a nominal cell group capacity $CAP_0$, a nominal temperature T, and a nominal group drop voltage $IR_0$. These expected battery parameters can be pre-calibrated and stored values or calculated real-time from a nominal cell group model of the battery. The second row and third row show the expected values of these battery parameters with respect to their nominal values when a single fuse is blown and two fuses are blown, respectively. The last row shows a general equation for expected values of these battery parameters when m fuses are blown.

Table 2 shows current safety limits for a cell group based on the number of fuses blown. The value $I_{lim}$ is the limiting current or maximum current of the battery pack or battery group.

TABLE 2

| #Fuses Blown | 0 | 1 | 2 | m |
|---|---|---|---|---|
| Pack I_new | $I_{lim}$ | $\frac{4}{5}I_{lim}$ | $\frac{3}{5}I_{lim}$ | $\frac{n-m}{n}I_{lim}$ |

A measured value of a battery parameter can be compared to the expected values of the battery parameter (from Table 1) to determine the number of fuses blown, as discussed below with respect to FIG. 5.

Figure 5:
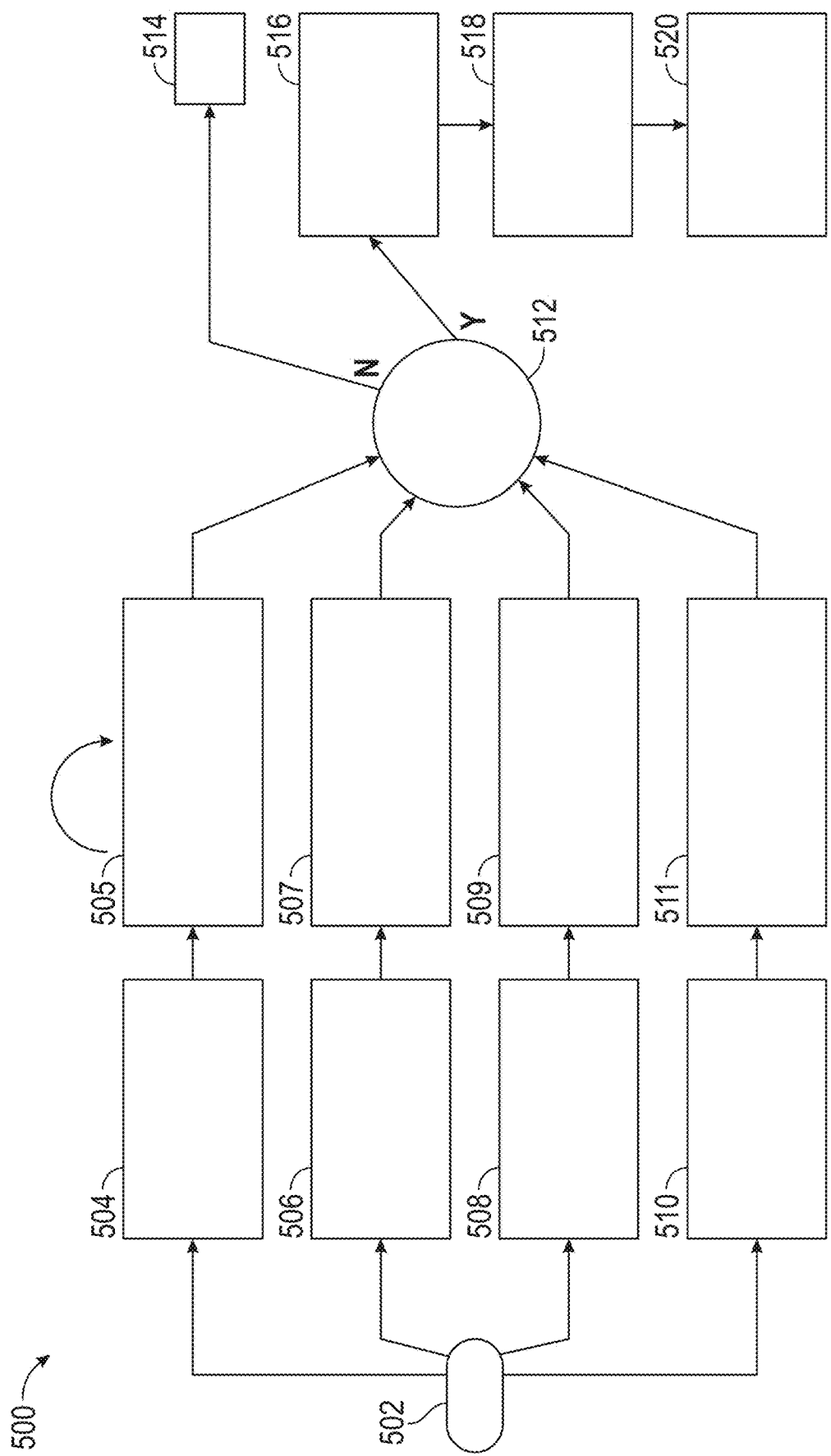
FIG. 5 shows a flowchart of a method for diagnosing a health of a battery pack and operating the vehicle based on the health of the battery pack.

FIG. 5 shows a flowchart 500 of a method for diagnosing a health of a battery pack and operating the vehicle 100 based on the health of the battery pack. The method starts at box 502. From box 502, the method proceeds to each of boxes 504, 506, 508 and 510. In box 504, a cell group resistance Rest is estimated from measurements. In box 505, a resistance ratio is made that compares the measured cell group resistance $R_{est}$ to the nominal resistance $R_0$ for the cell group. The resistance ratio is then compared to an expected resistance ratio for the cell group for each possible number of blown fuses (e.g., m=1, 2, 3, 4, 5), which can be found in Table 1. An equation suitable for evaluating the resistance is shown in Eq. (1):

$$\frac{R_{est}}{R_0} \approx \frac{n}{n-m} \pm \varepsilon_1 \qquad \text{Eq. (1)}$$

$$m = 1, 2, 3, 4, 5$$

where $\varepsilon_1$ is a suitable value for accommodating the effects of noise or inaccuracies in the resistance measurements. When Eq. (1) is satisfied for a value of m, then box 505 outputs an index value equal to 1. If Eq. (1) is not satisfied, box 505 outputs an index value equal to 0.

In box 506, a cell group capacity is estimated from measurements. In box 507, a capacity ratio is made that compares the measured cell group capacity to the nominal capacity $CAP_0$ for the cell group. The capacity ratio is then compared to the expected capacity ratio for each possible number of blown fuses for the cell group (e.g., m=1, 2, 3, 4, 5). An equation suitable for evaluating the capacity is shown in Eq. (2):

$$\frac{CAP_{est}}{CAP_0} \approx \frac{n-m}{n} \pm \varepsilon_2 \qquad \text{Eq. (2)}$$

$$m = 1, 2, 3, 4, 5$$

where $\varepsilon_2$ is a suitable value for accommodating noise or inaccuracies in the capacity measurements. When Eq. (2) is satisfied for a value of m, then box 505 outputs an index value equal to 1. If Eq. (2) is not satisfied, box 505 outputs an index value equal to 0.

In box 508, a group drop voltage is measured for the cell group. In box 509, the drop voltage is compared to a threshold value. If the drop voltage is greater than the threshold value, then box 309 output an index value equal to 0.5. Otherwise, box 509 outputs an index value equal to 0.

At box 510, a cell group temperature is measured. In box 511, the cell group temperature is compared to a temperature of an adjacent cell group, as shown in Eq. (3):

$$T > T_{adj} + C \qquad \text{Eq. (3)}$$

If the group temperature is greater than the temperature of the adjacent cell group by a pre-defined constant value C, then box 509 output an index value equal to 0.5. Otherwise, box 509 outputs an index value equal to 0.

The index values from boxes 505, 507, 509 and 511 are then received at box 512. In box 512, the index values are added together to obtain a composite value. If the composite value is a positive number but less than a threshold value (e.g., 2), the method proceeds to box 514 in which other diagnostic routines can be run. If the composite value is greater than the threshold value, the method proceeds to box 516. In box 516, the pack current limit is reset to its new current limit, as shown in Eq. (4):

$$I_{new} = \frac{n-m}{n} I_{lim} \qquad \text{Eq. (4)}$$

In box 518, the power available for the vehicle is determined based on the new current limit, which indicates an available current under the blown fuse condition. In box 520, an alert signal is sent to the driver to service the cell. The alert can be sent either automatically or when the available power is determined to be insufficient to meet the power demands of the electrical loads. Additionally, the controller 108 can control and operational state of the electrical loads by shutting off electrical loads to reduce the power demands to at or below the available power under the new current limit.

Figure 6:
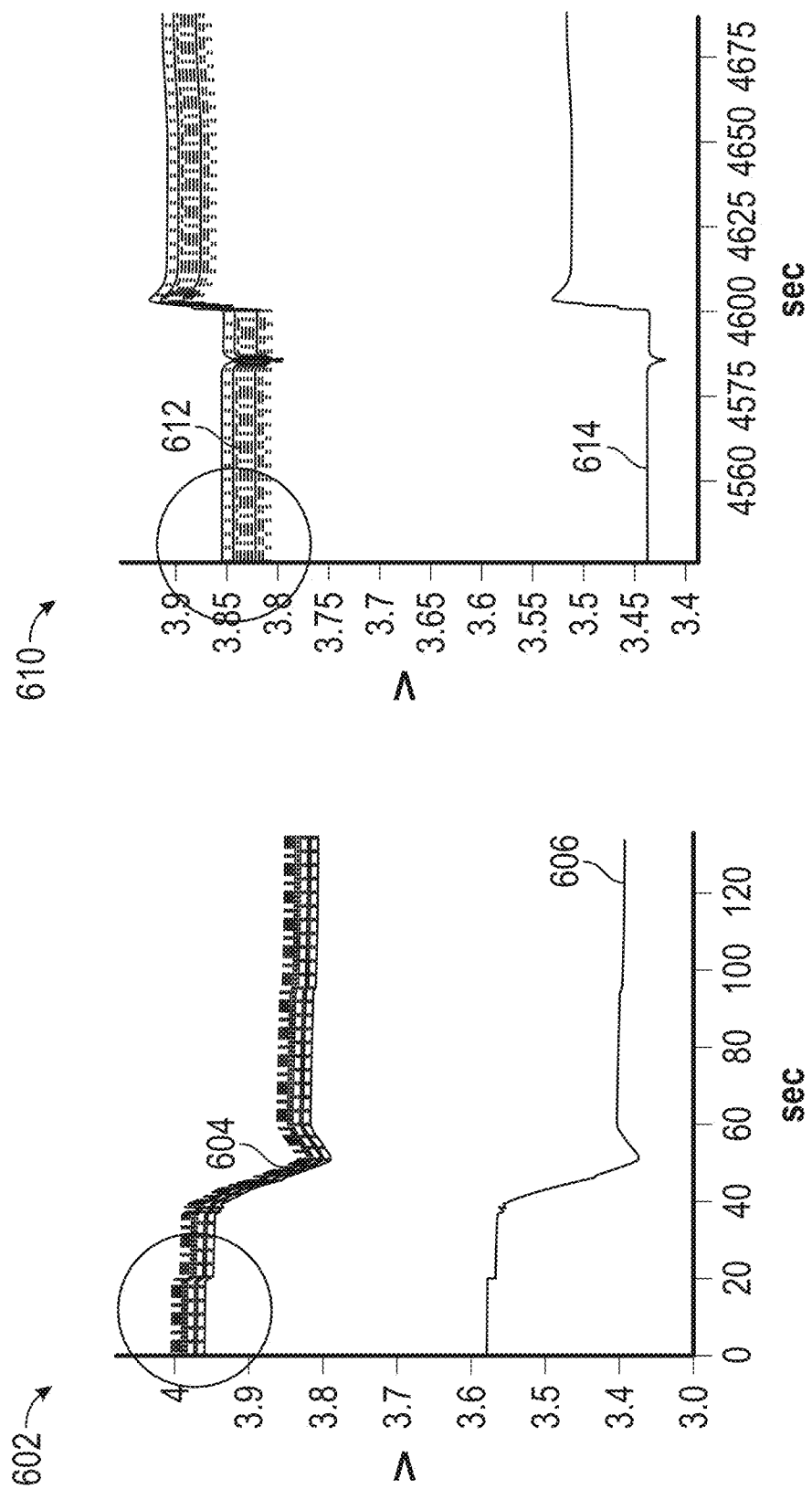
FIG. 6 shows timelines of group voltages that are suitable for use in determining capacity measurements.

FIG. 6 shows timelines of group voltages that are suitable for use in determining capacity measurements. First graph 602 shows voltage measurements obtained from battery cells during a first rest time (time=i) for the vehicle (i.e., when the vehicle is at rest during a first rest period). Time is shown along the abscissa in seconds and voltages is shown along the ordinate axis in volts. The first graph 602 includes a first set of curves 604 representing voltage measurements from healthy battery cells in a battery pack and a second curve 606 representing voltage measurements from an unhealthy, faulty or abnormal battery cell group. Similarly, second graph 610 shows voltage measurements obtained from battery cells during a second rest time during a second rest period (time=i+1). Time is shown along the abscissa in seconds and voltages is shown along the ordinate axis in volts. A first set of curves 612 represents voltage measurements from healthy battery cells in the pack. A second curve 614 shows voltage measurements from an unhealthy, faulty or abnormal battery cell group.

To determine the capacity ratio, voltage measurements are obtained at the first time (e.g., at t=0 seconds, first graph 602) and at a second time (e.g., at t=4550 seconds, second graph 610) are shown. For illustrative purposes, the first voltage measurement for the first set of curves 604 is $VOC_{nom}(1)=+3.98$ V and the first voltage measurement for the second curve 606 is $VOC_{ab}(1)=+3.58$ V. Also, the second voltage measurement for the first set of curves 604 is $VOC_{nom}(2)=+3.83$ V and the second voltage measurement for the second curve 606 is $VOC_{ab}(2)=+3.44$ V.

Figure 7:
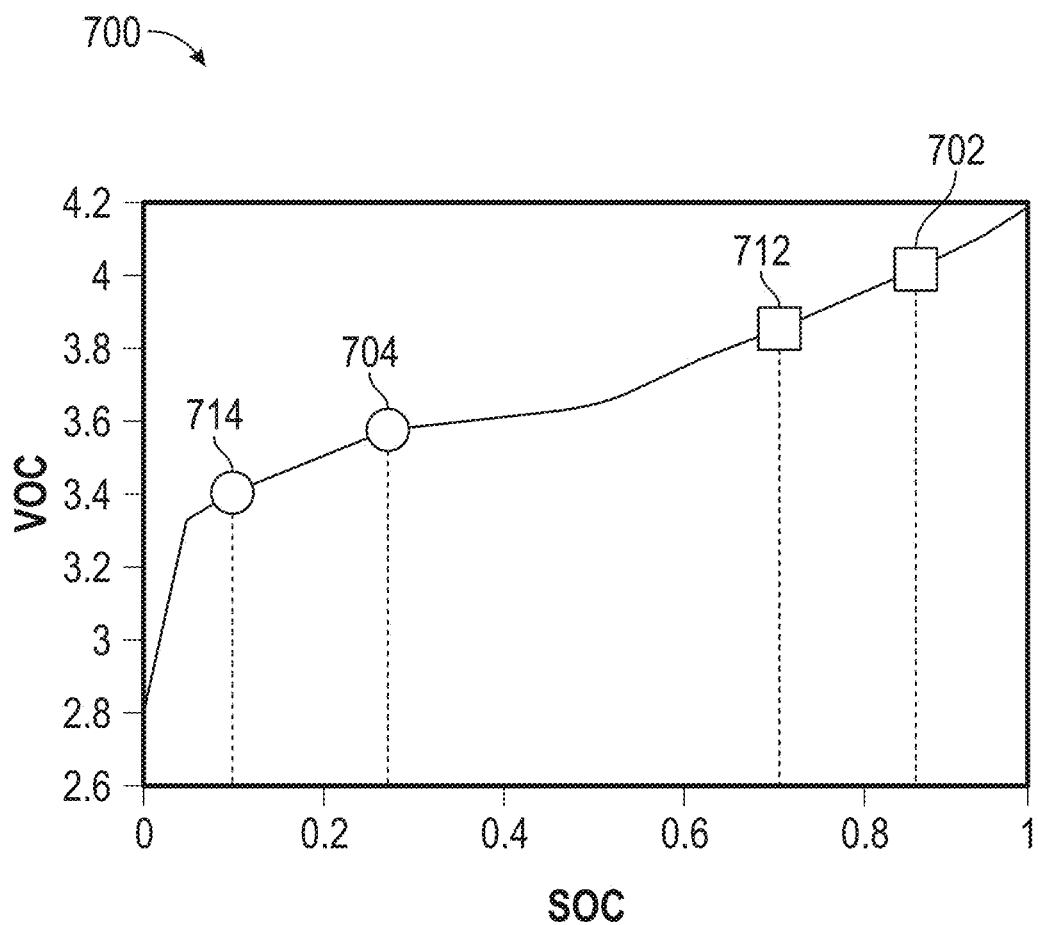
FIG. 7 shows a relation between open circuit voltage and state of charge that is suitable for determining capacity from voltage measurements.

FIG. 7 shows a relation 700 between open circuit voltage ($V_{OC}$) and state of charge (SOC) that is suitable for determining capacity from voltage measurements. SOC is shown along the abscissa and voltages is shown along the ordinate axis. Point 702 is the healthy voltage measurement (+3.98 V) and point 704 is the abnormal voltage measurement (+3.58 V) obtained at the first rest time. Point 712 is the health voltage measurement (+3.83 V) and point 714 is the abnormal voltage measurement (+3.44 V) obtained at the second rest time. This relation 700 is used as an inverse look-up table to determine the SOCs corresponding to each of the voltages.

A cell group capacity can be estimated once the SOCs have been determined. The estimated cell group capacity $CAP_{est}$ is a ratio of a change in SOC for the healthy cell groups from a battery pack to a change in SOC for the unhealthy, faulty or abnormal cell group, multiplied by the nominal battery pack capacity $CAP_{nom}$, as shown in Eq. (5)

$$CAP_{est} = \frac{f_{SOC}(VOC_{nom}(1)) - f_{SOC}(VOC_{nom}(2))}{f_{SOC}(VOC_{ab}(1)) - f_{SOC}(VOC_{ab}(2))} CAP_{nom} \quad \text{Eq. (5)}$$

where $CAP_{nom}$ is the nominal capacity. For the illustrative capacity, assuming a $CAP_{nom}$ of 155 amp-hours, the $CAP_{est}$ is 121 amp-hours, which represents a loss of 22% capacity in the cell group. Assuming m fuses have blown between the $i^{th}$ time step and the $(i+1)^{th}$ time step, their respective capacity ratio should be comparable to the expected m blown fuses, as shown in Eq. (6)

$$\frac{CAP_{est}(i+1)}{CAP_{est}(i)} = \frac{n-m}{n} \quad \text{Eq. (6)}$$

The method disclosed in FIGS. 6 and 7 avoids current sensor and integration errors and allow for a quick estimation of a capacity change.

Figure 8:
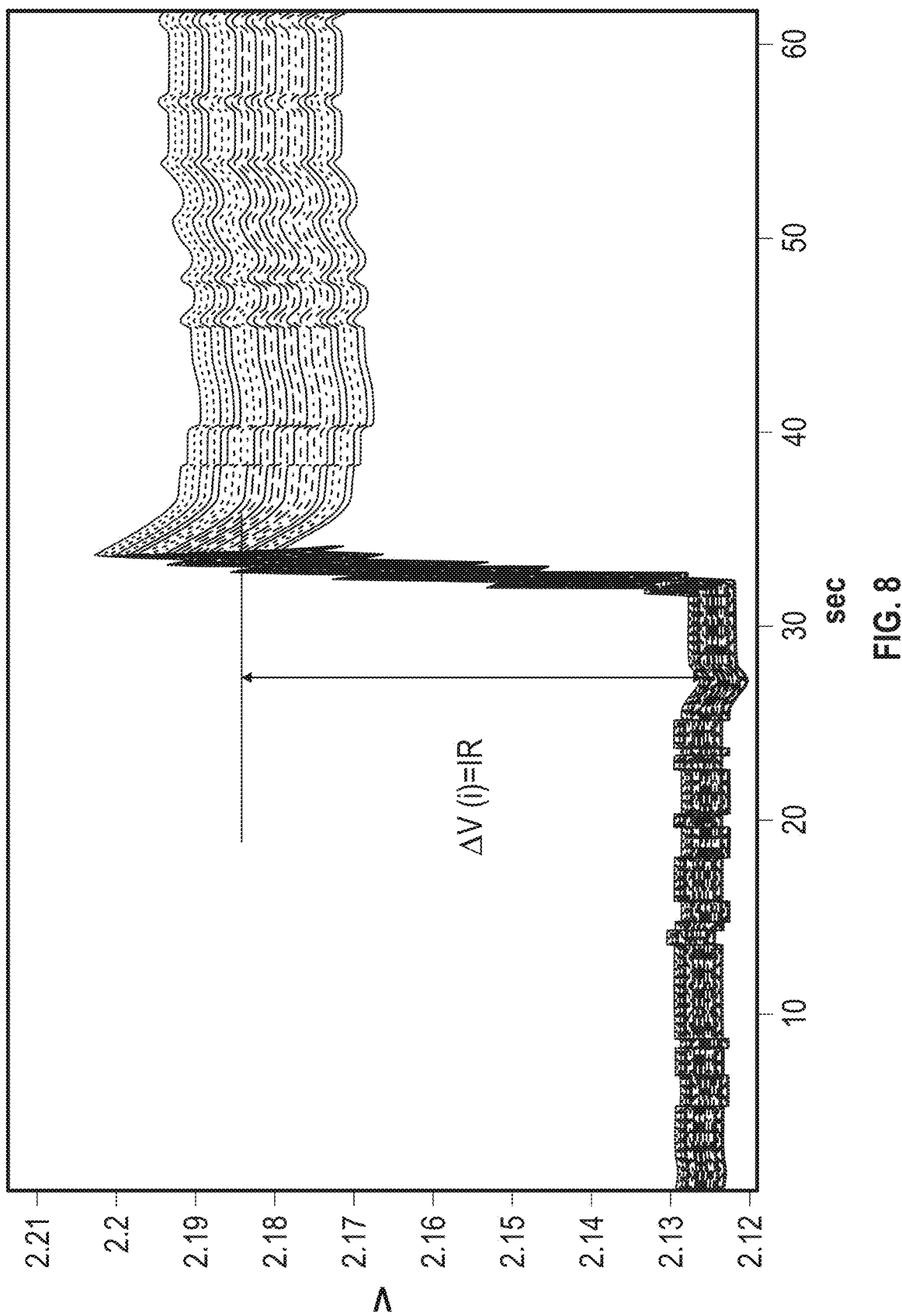
FIG. 8 shows voltage measurements obtained while applying a step charge current.

FIG. 8 shows voltage measurements obtained while applying a step charge current. Time is shown along the abscissa in seconds and voltages is shown along the ordinate axis in volts. These voltage measurements can be used to determine the resistivity ratio. The terminal voltage V(t) of the cell group is shown in Eq. (7):

$$V(t) = V_{OC} + IR \quad \text{Eq. (7)}$$

A step charge current or step discharge current is applied after the vehicle has been at rest for a specified rest (e.g., 5 minutes). Cell group voltages are measured and the cell groups are ranked based on voltage from a minimum voltage to a maximum voltage for the step charge test. A voltage ratio is then made between the voltage for a cell group and the voltage for an adjacent cell group in the ranked order. The voltage ratio is compared to an expected ratio based on number of fuses blown, as shown in Eq. (8):

$$\frac{\Delta V(i+1)}{\Delta V(i)} \approx \frac{n}{n-m} \quad \text{Eq. (8)}$$

where m=1, ..., n. Alternatively, a voltage ratio can be made between each cell group voltage and its baseline voltage, which is then compared to the expected ratio, as shown in Eq. (9):

$$\frac{\Delta V(i)}{\Delta V(i)_{nom}} \approx \frac{n}{n-m} \quad \text{Eq. (9)}$$

where m=1, ..., n.

Figure 9:
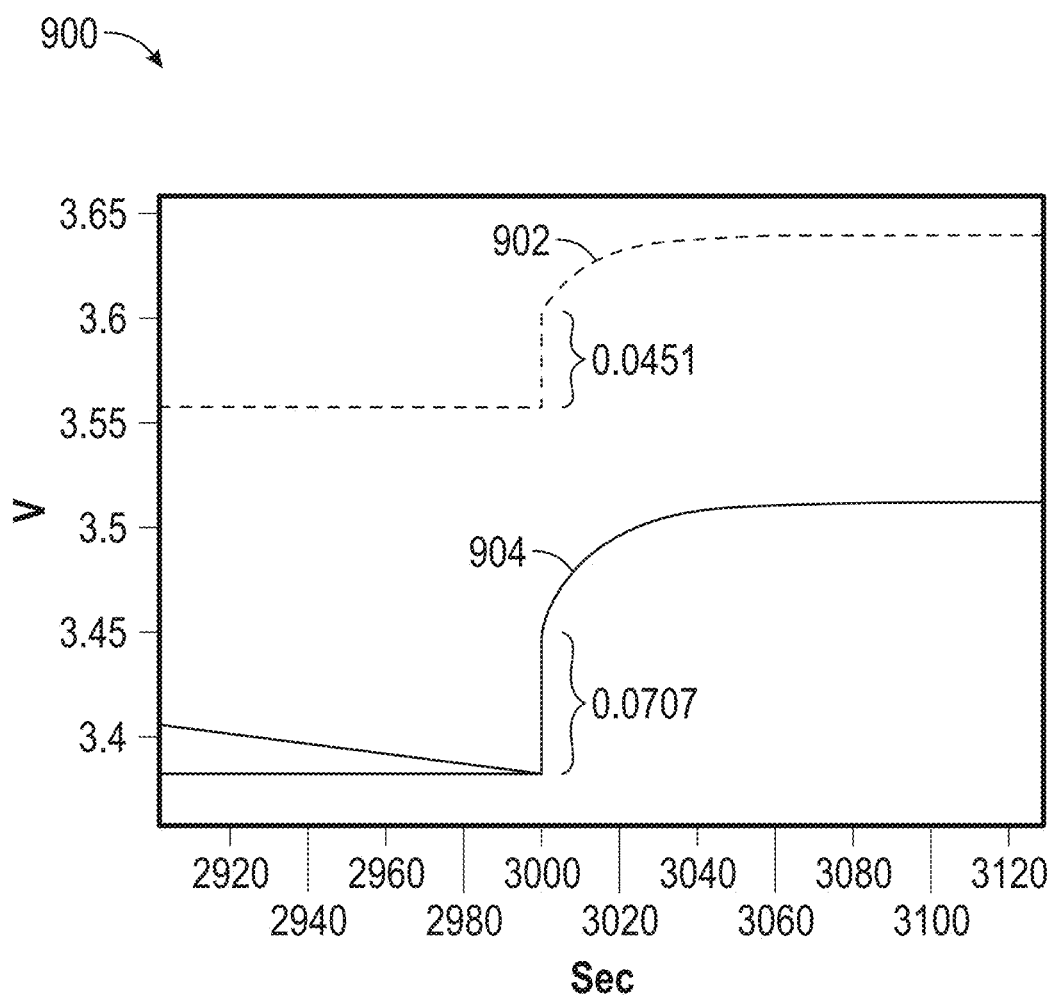
FIG. 9 shows a graph of drop voltages that occurs during a step charge event.

FIG. 9 shows a graph 900 of drop voltages that occurs during a step charge event. Time is shown along the abscissa in seconds and voltages is shown along the ordinate axis in volts. A first drop voltage 902 is shown for a healthy cell group and a second drop voltage 904 is shown for a faulty cell group. A value for the first drop voltage 902 is equal to 0.0451. A value for the second drop voltage 904 is equal to 0.0707. As shown in Eq. (10), a ratio of the drop voltage yields a resistance ratio.

$$\frac{\Delta V(i+1)}{\Delta V(i)} = \frac{IR_2}{IR_1} = \frac{R_2}{R_1} = \frac{0.0707}{0.0451} = 1.567 \quad \text{Eq. (10)}$$

The results of Eq. (10) can be compared to the expected resistance ratio to determine a number of blown fuses. By comparing Eqs. (9) and (10), m=2. Therefore, two fuses are blown in the cell group.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of operating a battery pack of a vehicle, comprising:
    obtaining a measured value of a battery parameter of the battery pack;
    calculating an expected value of the battery parameter from a model of the battery pack;
    calculating a first resistance ratio including the measured value, wherein the first resistance ratio is calculated based on a first drop voltage for a first cell group obtained during a rest period and a second drop voltage for a second cell group obtained during the rest period;
    comparing the first resistance ratio to a second resistance ratio including the expected value to determine a blown fuse condition of the battery pack;
    determining an available current from the battery pack based on the blown fuse condition; and
    controlling an operational state of the vehicle based on the available current.

2. The method of claim 1, wherein the expected value is indicative of a number of blown fuses in a cell group of the battery pack.

3. The method of claim 1, further comprising calculating a capacity ratio and comparing the capacity ratio to an expected capacity ratio.

4. The method of claim 3, further comprising calculating the capacity ratio using a first set of voltage measurements obtained from cell groups of the battery pack at a first time and a second set of voltage measurements obtained from the cell groups at a second time.

5. The method of claim 3, further comprising outputting a capacity index based on the comparison of the capacity ratio to the expected capacity ratio.

6. The method of claim 5, further comprising calculating a composite value from the resistance index and the capacity index and setting a current limit for the battery pack based on the composite value.

7. The method of claim 1, further comprising outputting a resistance index value based on a result of comparing the measured value to the expected value.

8. A system for operating a battery pack of a vehicle, comprising:
    one or more sensors for obtaining a measured value of a battery parameter of the battery pack; and
    a processor configured to:
        calculate an expected value of the battery parameter from a model of the battery pack;

calculate a first resistance ratio including the measured value, wherein the first resistance ratio is calculated based on a first drop voltage for a first cell group obtained during a rest period and a second drop voltage for a second cell group obtained during the rest period;

compare the first resistance ratio to a second resistance ratio including the expected value to determine a blown fuse condition of the battery pack;

determine an available current from the battery pack based on the blown fuse condition; and control an operational state of the vehicle based on the available current.

9. The system of claim 8, wherein the expected value is indicative of a number of blown fuses in a cell group of the battery pack.

10. The system of claim 8, wherein the processor is further configured to calculate a capacity ratio and compare the capacity ratio to an expected capacity ratio.

11. The system of claim 10, wherein the processor is further configured to calculate the capacity ratio using a first set of voltage measurements obtained from cell groups of the battery pack at a first time and a second set of voltage measurements obtained from the cell groups at a second time.

12. The system of claim 10, wherein the processor is further configured to output a capacity index based on the comparison of the capacity ratio to the expected capacity ratio.

13. The system of claim 12, wherein the processor is further configured to calculate a composite value from the resistance index and the capacity index and set a current limit for the battery pack based on the composite value.

14. The system of claim 8, wherein the processor is further configured to output a resistance index value based on a result of comparing the measured value to the expected value.

15. A vehicle, comprising:
a battery pack;
one or more sensors for obtaining a measured value of a battery parameter of the battery pack; and
a processor configured to:
calculate an expected value of the battery parameter from a model of the battery pack;
calculate a first resistance ratio including the measured value, wherein the first resistance ratio is calculated based on a first drop voltage for a first cell group obtained during a rest period and a second drop voltage for a second cell group obtained during the rest period;
compare the first resistance ratio to a second resistance ration including the expected value to determine a blown fuse condition of the battery pack;
determine an available current from the battery pack based on the blown fuse condition; and
control an operational state of the vehicle based on the available current.

16. The vehicle of claim 15, wherein the expected value is indicative of a number of blown fuses in a cell group of the battery pack.

17. The vehicle of claim 15, wherein the processor is further configured to calculate a capacity ratio and compare the capacity ratio to an expected capacity ratio.

18. The vehicle of claim 17, wherein the processor is further configured to calculate the capacity ratio using a first set of voltage measurements obtained from cell groups of the battery pack at a first time and a second set of voltage measurements obtained from the cell groups at a second time.

19. The vehicle of claim 17, wherein the processor is further configured to output a capacity index based on the comparison of the capacity ratio to the expected capacity ratio.

20. The vehicle of claim 15, wherein the processor is further configured to output a resistance index value based on a result of comparing the measured value to the expected value.

* * * * *